(12) United States Patent
Mignot et al.

(10) Patent No.: US 11,398,409 B2
(45) Date of Patent: Jul. 26, 2022

(54) METHOD OF FORMING A BEOL INTERCONNECT STRUCTURE USING A SUBTRACTIVE METAL VIA FIRST PROCESS

(71) Applicant: International Business Machines Corporation, Armonk, NY (US)

(72) Inventors: Yann Mignot, Slingerlands, NY (US); Yongan Xu, San Jose, CA (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 17/027,897

(22) Filed: Sep. 22, 2020

(65) Prior Publication Data
US 2022/0093459 A1    Mar. 24, 2022

(51) Int. Cl.
*H01L 21/768* (2006.01)
*H01L 21/3213* (2006.01)

(52) U.S. Cl.
CPC .. *H01L 21/76883* (2013.01); *H01L 21/32139* (2013.01); *H01L 21/76832* (2013.01); *H01L 21/76885* (2013.01)

(58) Field of Classification Search
CPC ......... H01L 21/76883; H01L 21/32139; H01L 21/76832; H01L 21/76885
See application file for complete search history.

(56) References Cited

U.S. PATENT DOCUMENTS

| | | | |
|---|---|---|---|
| 6,417,094 B1 | 7/2002 | Zhao et al. | |
| 6,627,093 B1 | 9/2003 | Froment et al. | |
| 7,226,853 B2 | 6/2007 | Bekiaris et al. | |
| 7,247,560 B1 | 7/2007 | Kinner et al. | |
| 9,343,400 B2 | 5/2016 | Lee et al. | |
| 10,168,075 B2 | 1/2019 | Chen et al. | |
| 10,177,031 B2* | 1/2019 | Bao | H01L 21/76898 |
| 2007/0134917 A1 | 6/2007 | Li et al. | |
| 2009/0087992 A1 | 4/2009 | Srivastava et al. | |
| 2013/0187273 A1* | 7/2013 | Zhang | H01L 23/53238 257/751 |
| 2016/0329278 A1 | 11/2016 | Bouche et al. | |
| 2019/0198444 A1 | 6/2019 | Amanapu et al. | |

* cited by examiner

*Primary Examiner* — Karen Kusumakar
(74) *Attorney, Agent, or Firm* — Scully, Scott, Murphy & Presser, P.C.; L. Jeffrey Kelly, Esq.

(57) ABSTRACT

A method of forming a BEOL interconnect structure having improved resistance-capacitance is provided in which a via metal layer is created by a first metallization process and thereafter shrunk by a subtractive etch; these steps relax the critical dimension, ensure a via straight profile, avoid via chamfering and bowing, and maximize metal volume. Top trench metallization is then performed above the via metal layer; this step eliminates reactive ion etch lag and ensures no metallization void issues.

20 Claims, 6 Drawing Sheets

METHOD OF FORMING A BEOL INTERCONNECT STRUCTURE USING A SUBTRACTIVE METAL VIA FIRST PROCESS

BACKGROUND

The present application relates to semiconductor interconnect technology, and more particularly to a method of forming a back-end-of-the-line (BEOL) interconnect structure.

In integrated circuits (ICs), interconnect structures are employed to connect two or more circuit elements (such as, for example, transistors) together electrically. The design and layout of the interconnect structures on an IC is vital to its proper function, performance, power efficiency, reliability, and fabrication yield.

Interconnect structures are formed in the back-end-of-the-line (BEOL) utilizing processes well known to those skilled in the art including, for example, single damascene or dual damascene processes. In such BEOL processes, the via lithographic critical dimension (CD) cannot be very large otherwise the large CD will break the design ground rule when two vias are spaced closely together. Also, and it such BEOL processes, a missing via or hole is another issue that may arise.

SUMMARY

A method of forming a BEOL interconnect structure having improved resistance-capacitance (R/C) is provided in which a via metal layer is created by a first metallization process and thereafter shrunk by a subtractive etch; these steps relax the critical dimension, ensure a via straight profile, avoid via chamfering and bowing, and maximize metal volume. Top trench metallization is then performed above the via metal layer; this step eliminates reactive ion etch lag (RIE LAG) and ensures no metallization void issues.

In one aspect of the present application, a method of forming a BEOL interconnect structure is provided. In one embodiment of the present application, the method includes forming a dielectric capping layer on a surface of a metal level, wherein the metal level includes a plurality of electrically conductive structures embedded in a dielectric material layer. Via openings are then formed into the dielectric capping layer, wherein each of the via openings physically exposes a surface of one of the electrically conductive structures embedded in the dielectric material layer. A first metal-containing layer is then formed in each of the via openings and on a topmost surface of the dielectric capping layer. Next, the first metal-containing layer is etched utilizing a patterned photoresist-containing structure as a first etch mask to provide first metal-containing structures, wherein each of the first metal-containing structures has a lower portion located in one of the via openings and an upper portion extending vertically upwards from the lower portion. A first interconnect dielectric material layer is then formed, by deposition and planarization, laterally adjacent to the upper portion of each of the first metal-containing structures. Next, a second metal-containing layer is formed on the first interconnect dielectric material layer and each of the first metal-containing structures, and thereafter the second metal-containing layer is etched utilizing another patterned photoresist-containing structure as a second etch mask to provide second metal-containing structures. A second interconnect dielectric material layer is then formed laterally adjacent to each of the second metal-containing structures and on the first interconnect dielectric material layer.

In another embodiment of the present application, the method includes forming a dielectric capping layer on a surface of a metal level, wherein the metal level includes a plurality of electrically conductive structures embedded in a dielectric material layer. Via openings are then formed into the dielectric capping layer, wherein each of the via openings physically exposes a surface of one of the electrically conductive structures embedded in the dielectric material layer. A selective metal-containing cap is then formed in each of the via openings. Next, a first metal-containing layer is formed on each of the selective metal-containing caps and on a topmost surface of the dielectric capping layer. The first metal-containing layer is then etched utilizing a patterned photoresist-containing structure as a first etch mask to provide first metal-containing structures. Next, a first interconnect dielectric material layer is formed, by deposition and planarization, laterally adjacent to each of the first metal-containing structures. A second metal-containing layer is then formed on the first interconnect dielectric material layer and each of the first metal-containing structures, and thereafter the second metal-containing layer is etched utilizing another patterned photoresist-containing structure as a second etch mask to provide second metal-containing structures. A second interconnect dielectric material layer is then formed laterally adjacent to each of the second metal-containing structures and on the first interconnect dielectric material layer.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
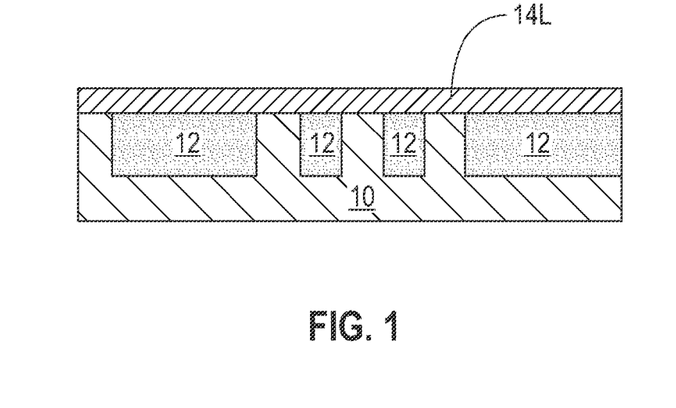
FIG. 1 is a cross sectional view of an initial BEOL interconnect structure including a dielectric capping layer located on a metal level containing a plurality of electrically conductive structures embedded in a dielectric material layer that can be employed in accordance with an embodiment of the present application.

Referring first to FIG. 1, there is illustrated an initial BEOL interconnect structure that can be employed in accordance with an embodiment of the present application. The initial BEOL interconnect structure illustrated in FIG. 1 includes a dielectric capping layer 14L located on a metal level containing a plurality of electrically conductive structures 12 embedded in a dielectric material layer 10.

It is noted that the BEOL interconnect structure illustrated in FIG. 1 is located above a front-end-of-the-line (FEOL) level (not shown) that contains one or more semiconductor devices such as, for example, one or more transistors. In some embodiments, the metal level illustrated in FIG. 1 is a middle-of-the-line (MOL) level. In other embodiments, the structure illustrated in FIG. 1 is a lower interconnect level of a multi-layered BEOL interconnect structure.

In some embodiments not shown, a diffusion barrier liner can be located at least on the sidewalls and, optionally, a bottommost surface of each electrically conductive structure 12. Typically, each electrically conductive structure 12 has a topmost surface that is coplanar with a topmost surface of the dielectric material layer 10, and if present, a topmost surface of the diffusion barrier liner.

The dielectric material layer 10 can be composed of any interlayer/interlevel dielectric (ILD) material including inorganic ILD materials and/or organic ILD materials. In some embodiments, the dielectric material layer 10 may be porous. In other embodiments, the dielectric material layer 10 may be non-porous. Examples of suitable dielectric materials that can be employed as the dielectric material layer 10 include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The dielectric material layer 10 can have a dielectric constant (all dielectric constants mentioned herein are measured relative to a vacuum, unless otherwise stated) that is 4.0 or less. In one embodiment, the dielectric material layer 10 has a dielectric constant of 2.8 or less (i.e., an ultra-low-k (ULK) dielectric material is used). These ULK dielectric materials generally have a lower parasitic cross talk as compared to dielectric materials whose dielectric constant is greater than 4.0. Examples of ULK dielectric materials that can be employed as the dielectric material layer 10 include, but are not limited to, OMCTS (octamethylcyclotetrasiloxane) and SiNCH.

The dielectric material layer 10 can be formed by a deposition process such as, for example, chemical vapor deposition (CVD), plasma enhanced chemical vapor deposition (PECVD) or spin-on coating. The dielectric material layer 10 can have a thickness from 50 nm to 250 nm. Other thicknesses that are lesser than 50 nm, and greater than 250 nm can also be employed in the present application.

After providing the dielectric material layer 10, openings (not shown) are formed into the dielectric material layer 10; each opening will house one of the electrically conductive structures 12 and, if present, a first diffusion barrier liner (not shown). In some embodiments, each of the openings that are formed into the dielectric material layer 10 are via openings. Via openings can be formed by lithography and etching. In other embodiments, each of the openings that are formed into the dielectric material layer 10 are line openings. The line openings can be formed by lithography and etching. In a further embodiment, the openings that are formed into the dielectric material layer 10 are combined via/line openings. The combined via/line openings can be formed utilizing two lithographic and etching steps. In other embodiments, some of the openings that are formed into the dielectric material layer 10 are via openings, while other openings that are formed into the dielectric material layer 10 are line openings.

In one embodiment of the present application, each opening that is formed into the dielectric material layer 10 can extend partially through the dielectric material layer 10. In another embodiment of the present application, each opening that is formed into the dielectric material layer 10 can extend entirely through the dielectric material layer 10. In yet a further embodiment of the present application, some of the openings that are formed into the dielectric material layer 10 extend partially through the dielectric material layer 10, while other openings extend entirely through the dielectric material layer 10.

When a diffusion barrier liner is present, a diffusion barrier material layer is formed in each opening and on a topmost surface of the dielectric material layer 10. The diffusion barrier material layer can be composed of Ta, TaN, Ti, TiN, Ru, RuN, RuTa, RuTaN, W, WN or any other material that can serve as a barrier to prevent an electrically conductive material such as, for example, Cu, from diffusing there through. In some embodiments, the diffusion barrier material layer can have a thickness from 2 nm to 10 nm; although other thicknesses for the diffusion barrier material layer are contemplated and can be employed in the present application as long as the diffusion barrier material layer does not entirety fill the opening that is formed into the dielectric material layer 10. The diffusion barrier material layer can be formed by a deposition process including, for example, CVD, PECVD, atomic layer deposition (ALD), physical vapor deposition (PVD), sputtering, chemical solution deposition or plating.

In some embodiments, an optional plating seed layer (not specifically shown) can be formed at the bottom of each of the openings that are formed into the dielectric material layer 10. In other embodiments, the optional plating seed layer is not needed. The optional plating seed layer is employed to selectively promote subsequent electroplating of a pre-selected conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu-containing metal is to be subsequently formed within the at least one opening. The thickness of the optional plating seed layer may vary depending on the material of the optional plating seed layer as well as the technique used in forming the same. Typically, the optional plating seed layer has a thickness from 2 nm to 20 nm. The optional plating seed layer can be formed by a conventional deposition process including, for example, CVD, PECVD, ALD, or PVD.

Next, an electrically conductive metal or metal alloy layer is formed into each opening and, if present, on the diffusion barrier material layer. The electrically conductive metal or metal alloy layer provides the first electrically conductive structures 12 of the present application. The electrically conductive metal or metal alloy layer can be composed of Cu, Al, W, Ru, Co or an alloy thereof such as, for example, a Cu—Al alloy. The electrically conductive metal or metal alloy layer can be formed utilizing a deposition process such as, for example, CVD, PECVD, sputtering, chemical solution deposition or plating. In one embodiment, a bottom-up plating process is employed in forming the electrically conductive metal or metal alloy layer. In some embodiments, the electrically conductive metal or metal alloy layer is formed above the topmost surface of the dielectric material layer 10.

Following deposition of the electrically conductive metal or metal alloy layer, a planarization process such as, for example, chemical mechanical polishing (CMP) and/or grinding, can be used to remove all electrically conductive metal or metal alloy (i.e., overburden material) that is present outside each of the openings forming the electrically conductive structures 12 embedded in the dielectric material layer 10. In the illustrated embodiment, the planarization stops on a topmost surface of the dielectric material layer 10. Thus, and if present, the planarization process also removes the diffusion barrier material layer from the topmost surface of the dielectric material layer 10. The remaining portion of the diffusion barrier material layer that is present in each of the openings is referred to herein as a diffusion barrier liner, while the remaining electrically conductive metal or metal alloy layer that is present in each of the openings is referred to as electrically conductive structure 12.

After forming the metal level containing the plurality of electrically conductive structures 12 embedded in the dielectric material layer 10, dielectric capping layer 14L is formed on the metal level. Notably, the dielectric capping layer 14L is formed on a physically exposed topmost surface of each of the electrically conductive structures 12 and on a physically exposed topmost surface of the dielectric material layer 10. Dielectric capping layer 14L is composed of a dielectric material that is typically, but not necessarily always, compositionally different from the dielectric material that provides the dielectric material layer 10. Illustrative examples of dielectric materials that can be used as the dielectric capping layer 14L include, but are not limited to, SiN, SiC, $Si_3N_4$, $SiO_2$, $AlO_x$, a carbon doped oxide, a nitrogen and hydrogen doped silicon carbide SiC(N,H) or multilayers thereof. The dielectric capping layer 14L can be formed utilizing a deposition process such as, for example, CVD, PECVD, chemical solution deposition, evaporation, or ALD. The dielectric capping layer 14L can have a thickness from 5 nm to 50 nm; although other thicknesses for the dielectric capping layer 14L are possible and can be used in the present application.

Figure 2:
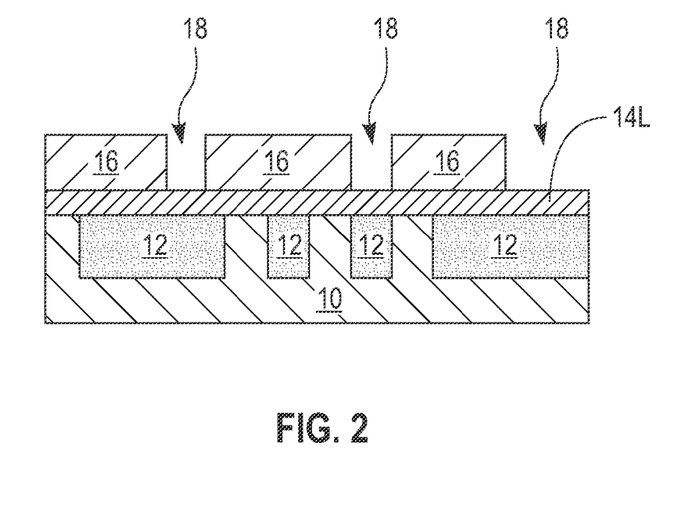
FIG. 2 is a cross sectional view of the initial BEOL interconnect structure of FIG. 1 after forming a first patterned photoresist-containing structure on the dielectric capping layer.

Referring now to FIG. 2, there is illustrated the initial BEOL interconnect structure of FIG. 1 after forming a first patterned photoresist-containing structure 16 on the dielectric capping layer 14L. As is illustrated, openings 18 are present in the first patterned photoresist-containing structure 16. Each opening 18 that is present in the first patterned photoresist-containing structure 16 physically exposes a topmost surface of the dielectric capping layer 14L. The openings 18 that are present in the first patterned photoresist-containing structure 16 overlay some of the electrically conductive structures 12 that are present dielectric material layer 10. In the present application, each opening 18 is designed to be a via opening. The term "via opening" denotes an opening that will connect a bottom and top trench connection. Usually, the via openings, and thus the via structure formed therein, are circular in shape.

The term "patterned photoresist-containing structure" is used throughout the present application to denote a lithographically patterned structure that includes at least a photoresist material. The patterned photoresist-containing structure can include one or more additional materials located beneath (i.e., underlying) the photoresist material. The patterned photoresist-containing structure (including the first patterned photoresist-containing structure 16 illustrated in FIG. 2) can thus include one of the following embodiments:

a single layer structure composed entirely of a photoresist material, a bilayer structure including, from top to bottom, a photoresist material and an antireflective coating (ARC or BARC for a bottom ARC), a trilayer structure including, from top to bottom, a photoresist material, a hard mask (such as silicon dioxide or SiARC), and an organic planarization layer (OPL), or a quadlayer structure including, from top to bottom, a photoresist material, a BARC for adhesion, a hard mask (such as silicon dioxide), and an OPL. The OPL can be composed of a flowable organic material such as, for example, a spin-on-carbon (SOC).

The patterned photoresist-containing structure (including the first patterned photoresist-containing structure 16 illustrated in FIG. 2) can be formed by techniques well known to those skilled in the art. For example, the patterned photoresist-containing structure (including the first patterned photoresist-containing structure 16) can be formed by depositing the various materials that provide the patterned photoresist-containing structure utilizing well known deposition techniques such as, for example, CVD, PECV or spin-on coating. The deposited photoresist material, which is present as a topmost layer of the patterned photoresist-containing structure, is then subjected to lithographic patterning which includes exposing the photoresist material to a predetermined pattern of irradiation and thereafter developing the exposed photoresist material to provide a patterned photoresist. Photoresist exposure can be performed using a variety of equipment and techniques which are defined by the resolution required. Examples include optical lithography or extreme ultraviolet (EUV) lithography. An etch such as, for example, reactive ion etching (RIE) or ion beam etching (IBE), can then be used to transfer the patterned formed into the photoresist material into the underlying materials that are also present in the patterned photoresist-containing structure. This etch step can be omitted if the patterned photoresist-containing structure contains no underlying materials beneath the photoresist material.

Figure 3:
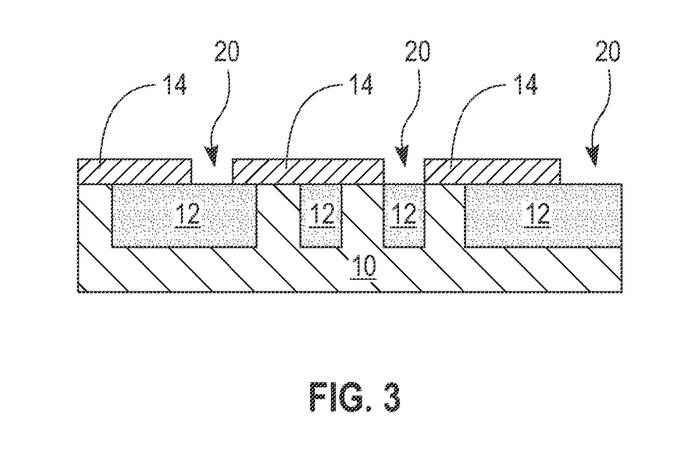
FIG. 3 is a cross sectional view of the initial BEOL interconnect structure of FIG. 2 after forming via openings in the dielectric capping layer using the first patterned photoresist-containing structure as an etch mask, and thereafter removing the first patterned photoresist-containing structure, wherein each via opening physically exposes a surface of one of the electrically conductive structures which is embedded in the dielectric material layer.

Referring now to FIG. 3, there is illustrated the initial BEOL interconnect structure of FIG. 2 after forming via openings 20 in the dielectric capping layer 14L using the first patterned photoresist-containing structure 16 as an etch mask, and thereafter removing the first patterned photoresist-containing structure 16. As is illustrated, each via opening 20 physically exposes a surface of one of the electrically conductive structures 12 which is embedded in the dielectric material layer 10. The dielectric capping layer 14L that remains after performing this etch can be referred to as a patterned dielectric capping layer 14.

The via openings 20 that are formed into the dielectric capping layer 14L can be formed utilizing an etching process such as, for example, RIE, that is selective in removing the physically exposed portion of the dielectric capping layer 14L that is not protected by the first patterned photoresist-containing structure 16. The etch used in forming the via openings 20 typically stops on a topmost surface of an underlying electrically conductive structure 12. In some embodiments (not shown), the etch used in forming the via openings 20 can remove an upper portion of an electrically conductive structure 12 that is embedded in the dielectric material layer 10.

The first patterned photoresist-containing structure 16 is removed after the dielectric capping layer 14L has been 'opened' utilizing techniques well known to those skilled in the art. For example, a resist stripping process such as, for example, ashing can be used in conjunction with one or more material removal processes such as, for example, etching and/or planarization.

Figure 4A:
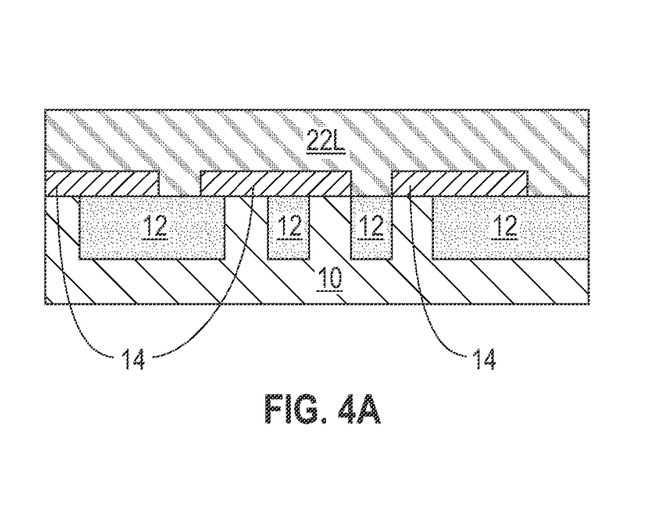
FIG. 4A is a cross sectional view of the initial BEOL interconnect structure of FIG. 3 after forming a first metal-containing layer in each via opening and on the patterned dielectric capping layer in accordance with one embodiment of the present application.

Referring now to FIG. 4A, there is illustrated the initial BEOL interconnect structure of FIG. 3 after forming a first metal-containing layer 22L in each via opening 20 and on the patterned dielectric capping layer 14 in accordance with one embodiment of the present application. In this embodiment, a bottom portion of the first metal-containing layer 22L in each via opening 20 is in direct physical contact with a physically exposed surface of one of the electrically conductive structures 12 that is embedded in the dielectric material layer 10.

The first metal-containing layer 22L is composed of an electrically conductive metal or metal alloy that is typically, but not necessarily always, compositionally different from the electrically conductive metal or metal alloy that provides the electrically conductive structures 12. In some embodiments, the first metal-containing layer 22L can be composed of Co, Ru, Al or W. The first metal-containing layer 22L can be formed utilizing a deposition process such as, for example, CVD, PECVD, sputtering, chemical solution deposition or plating.

Figure 4B:
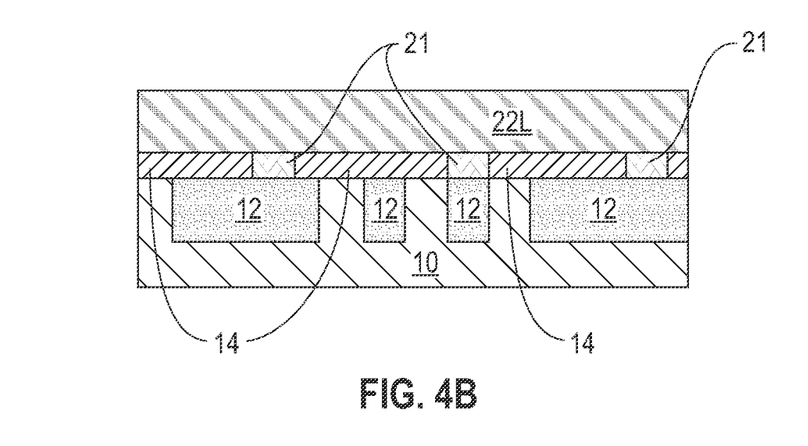
FIG. 4B is a cross sectional view of the initial BEOL interconnect structure of FIG. 3 after forming a selective metal-containing cap in each via opening, and thereafter forming a first metal-containing layer on the patterned dielectric capping layer and on each selective metal-containing cap in accordance with another embodiment of the present application.

Referring now to FIG. 4B, there is illustrated the initial BEOL interconnect structure of FIG. 3 after forming a selective metal-containing cap 21 in each via opening 20, and thereafter forming a first metal-containing layer 22L on the patterned dielectric capping layer 14 and on each selective metal-containing cap 21 in accordance with another embodiment of the present application. In this embodiment, a bottom portion of the selective metal-containing cap 21 that is present in each via opening 20 is in direct physical contact with a physically exposed surface of one of the electrically conductive structures 12 that is in embedded in the dielectric material layer 10. Each selective metal-containing cap 21 typically has a topmost surface that coplanar with a topmost surface of the patterned dielectric capping layer 14. The presence of the selective metal-containing cap 21 in the BEOL interconnect structure helps to improve the R/C of the final BEOL interconnect structure and to ensure that the final BEOL interconnect structure is a planar structure.

The selective metal-containing cap 21 is composed of an electrically conductive metal or metal alloy that is typically, but not necessarily always, compositionally different from the electrically conductive metal or metal alloy that provides the electrically conductive structures 12. The electrically conductive metal or metal alloy that provides the selective metal-containing cap 21 can be compositionally the same as, or compositionally different from, the electrically conductive metal or metal alloy that provides the first metal-containing layer 22L. In one embodiment, the selective metal-containing cap 21 is composed of Co. The selective metal-containing cap 21 can be formed utilizing a selective deposition process such as, for example, Co electroplating. A planarization process such as, for example, chemical mechanical planarization (CMP), may, or may not, follow the selective deposition process. The planarization of the selective metal-containing caps 21 is performed to optimize the final thickness of the selective metal-containing caps 21 and the patterned dielectric capping layer 14 and/or to remove extra material created during the formation of the selective meta-containing caps 21.

The first metal-containing layer 22L is composed of an electrically conductive metal or metal alloy that can be compositionally the same as, or compositionally different from the electrically conductive metal or metal alloy that provides the electrically conductive structures 12 and/or the electrically conductive metal or metal alloy that provides the metal-containing cap 21. In some embodiments, and when the electrically conductive structures 12 are composed of Cu, the first metal-containing layer 22L and the metal-containing cap 21 can be composed of Co, Ru, Al or W. The first metal-containing layer 22L can be formed utilizing a deposition process such as, for example, CVD, PECVD, sputtering, chemical solution deposition or plating.

Figure 5:
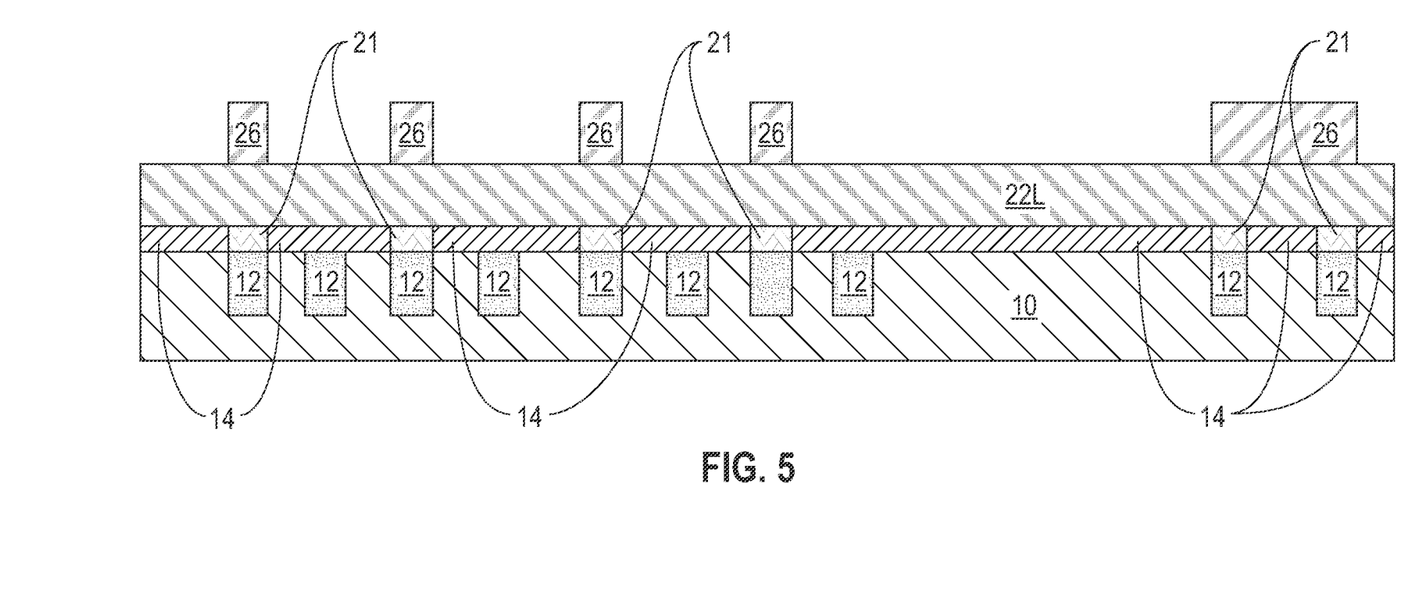
FIG. 5 is a cross sectional view of a BEOL interconnect structure similar to FIG. 4B after forming a second patterned photoresist-containing structure on the first metal-containing layer.

Referring now to FIG. 5, there is illustrated a BEOL interconnect structure similar to the one depicted in FIG. 4B after forming a second patterned photoresist-containing structure 26 on the first metal-containing layer 22L; the BEOL interconnect structure shown in FIG. 5 provides an expanded view of the BEOL interconnect structure shown in FIG. 4B and each electrically conductive structure 12 is shown as having a same width.

It should be noted that although the present application describes and illustrates processing of the BEOL interconnect structure shown in FIG. 4B, the processing steps shown in FIG. 5, and in FIG. 6-11 to follow, can be used in processing the structure shown in FIG. 4A of the present application.

The second patterned photoresist-containing structure 26 can include one of the patterned photoresist-containing structures mentioned above for the first patterned photoresist-containing structure 16. Typically, the second patterned photoresist-containing structure 26 is either a trilayer structure, as defined above, or a quad layer structure, as defined above. The second patterned photoresist-containing structure 26 can be formed utilizing techniques mentioned above for forming a patterned photoresist-containing structure. Photoresist exposure can include any of the equipment and techniques mentioned above, e.g., optical lithography or EUV lithography), in forming the patterned photoresist-containing structure.

Figure 6:
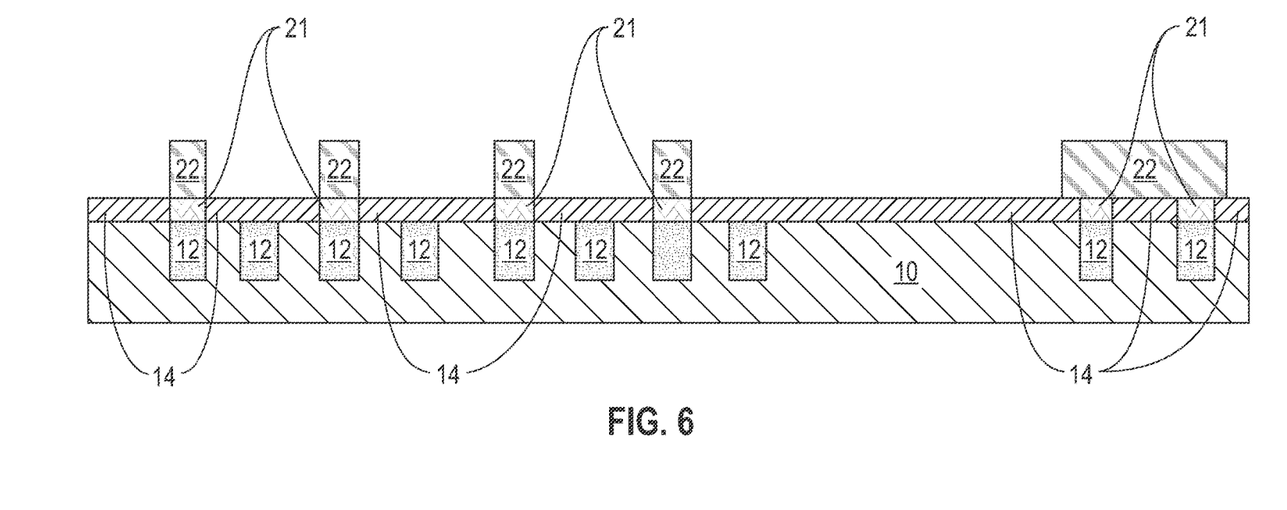
FIG. 6 is a cross sectional view of the BEOL interconnect structure of FIG. 5 after etching the first metal-containing layer to provide first metal-containing structures, and thereafter removing the second patterned photoresist-containing structure.

Referring now to FIG. 6, there is illustrated the BEOL interconnect structure of FIG. 5 after etching the first metal-containing layer 22L to provide first metal-containing structures 22 and removing the second patterned photoresist-containing structure 26. The etching of the first metal-containing layer 22L utilizes the second patterned photoresist-containing structure 26 as an etch mask. Each first metal-containing structure 22 constituents a remaining (i.e., non-etched) portion of the first metal-containing layer 22L.

Each first metal-containing structure 22 is a via structure whose dimensions may be the same or different from each other. In the embodiment illustrated in FIG. 6, the first metal-containing structures 22 on the left hand side of the drawing have a first dimension, while the first metal-containing structure 22 on the right hand side of the drawing has a second dimension that is larger than the first dimension; the first metal-containing structure 22 on the right hand side of the drawing can be referred to as a via bar structure.

The etching of the first metal-containing layer 22L can include any etching process such as, for example, RIE, that is selective in removing the first metal-containing layer 22L that is not protected by the second patterned photoresist-containing structure 26. This RIE chemistry needs to be very selective to the dielectric capping layer 14L. In one example, the RIE used in etching the first metal-containing layer 22L includes a mixture of $Cl_2/BCl_3$—Ar—$CH_4$.

The second patterned photoresist-containing structure 26 can be removed utilizing techniques well known to those skilled in the art. For example, the second patterned photoresist-containing structure 26 can be removed utilizing a resist stripping process such as, for example, ashing, together with one or more material removal processes such as, for example, etching and/or planarization.

Figure 7:
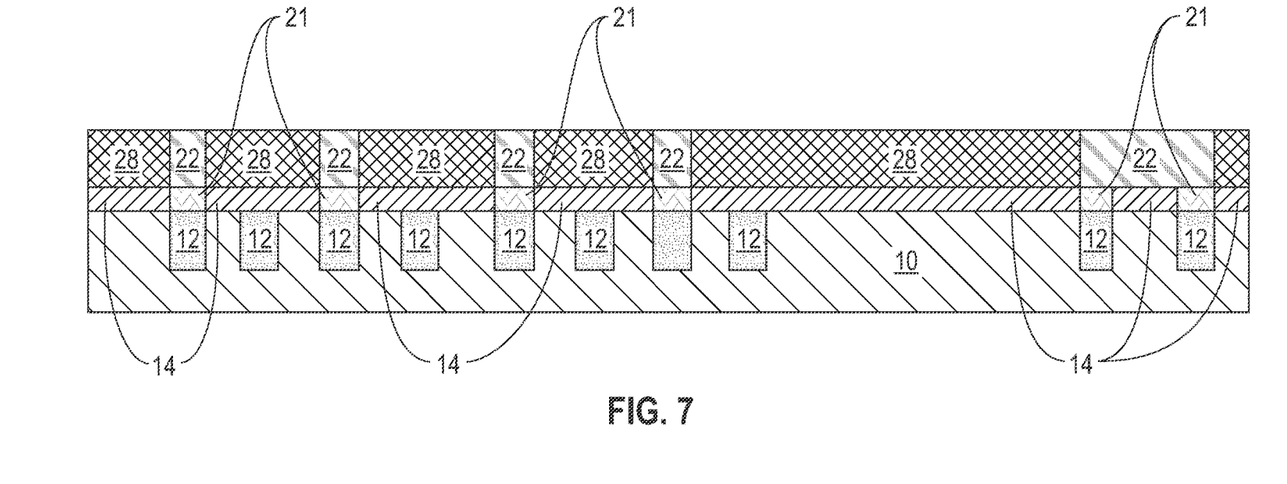
FIG. 7 is a cross sectional view of the BEOL interconnect structure of FIG. 6 after forming, by deposition and planarization, a first interconnect dielectric material layer laterally adjacent to each first metal-containing structure.

Referring now to FIG. 7, there is illustrated the BEOL interconnect structure of FIG. 6 after forming a first interconnect dielectric material layer 28 laterally adjacent to each first metal-containing structure 22. The first interconnect dielectric material layer 28 is located on a topmost surface of the patterned dielectric capping layer 14. The first interconnect dielectric material layer 28 has a topmost a surface that is typically coplanar with a topmost surface of each first metal-containing structure 22.

The first interconnect dielectric material layer 28 can include one of the ILD materials mentioned above for the dielectric material layer 10. In one embodiment, the first interconnect dielectric material layer 28 is composed of a compositionally same dielectric material as the dielectric material layer 10. In another embodiment, the first interconnect dielectric material layer 28 is composed of a dielectric material that is compositionally different from the dielectric material that provides the dielectric material layer 10. The first interconnect dielectric material layer 28 can be formed utilizing one of the deposition processes mentioned above for forming the dielectric material layer 10. Following the deposition of the dielectric material that provides the first interconnect dielectric material layer 28, a planarization process such as, for example, CMP, can be used to provide the planar BEOL interconnect structure shown in FIG. 7.

Figure 8:
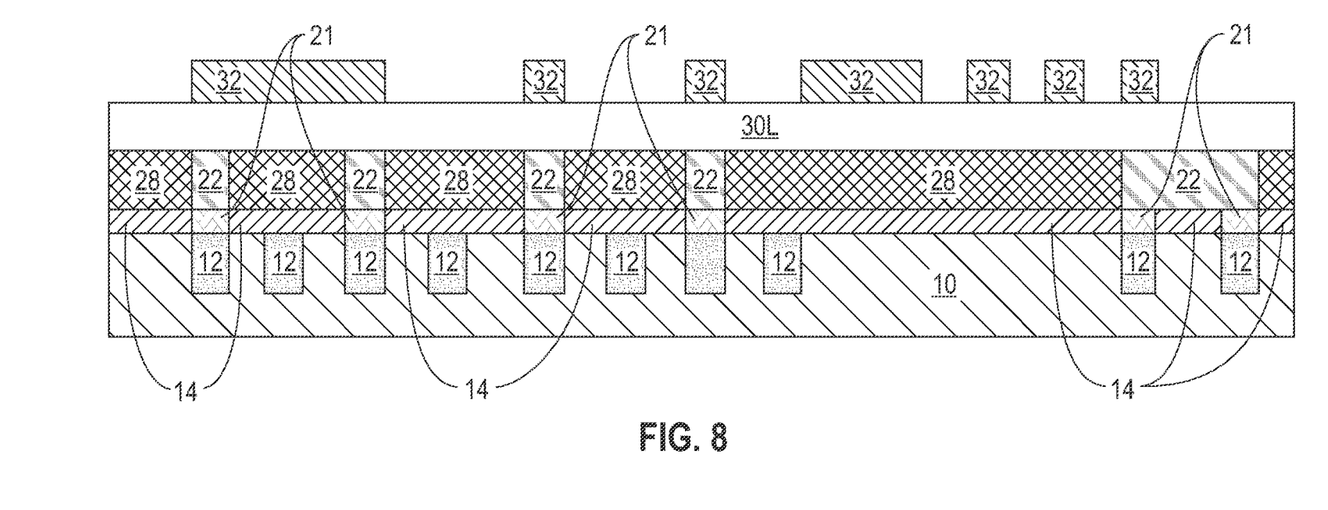
FIG. 8 is a cross sectional view of the BEOL interconnect structure of FIG. 7 after forming a second metal-containing layer on the first interconnect dielectric material layer and each first metal-containing structure, and thereafter forming a third patterned photoresist-containing structure on the second metal-containing layer.

Referring now to FIG. 8, there is illustrated the BEOL interconnect structure of FIG. 7 after forming a second metal-containing layer 30L on the first interconnect dielectric material layer 28 and each first metal-containing structure 22, and thereafter forming a third patterned photoresist-containing structure 32 on the second metal-containing layer 30L.

The second metal-containing layer 30L is composed of an electrically conductive metal or metal alloy that is compositionally different from the first metal-containing layer 22L that provides the first metal-containing structures 22. Notably, the electrically conductive metal or metal alloy that provides the second metal-containing layer 30L can include one of the electrically conductive metals or metal alloys mentioned above for the first metal-containing layer 22L so long as the electrically conductive metal or metal alloy that provides the second metal-containing layer 30L differs from the electrically conductive metal or metal alloy that provides the first metal-containing layer 22L. The second metal-containing layer 30L can be formed utilizing one of the deposition processes mentioned above for forming the first metal-containing layer 22L.

The third patterned photoresist-containing structure 32 can include one of the patterned photoresist-containing structures mentioned above for the first patterned photoresist-containing structure 16. Typically, the third patterned photoresist-containing structure 32 is either a trilayer structure, as defined above, or a quad layer structure, as defined above. The third patterned photoresist-containing structure 32 can be formed utilizing techniques mentioned above for forming a patterned photoresist-containing structure. Photoresist exposure can include any of the equipment and techniques mentioned above, e.g., optical lithography or EUV lithography), in forming the patterned photoresist-containing structure.

Figure 9:
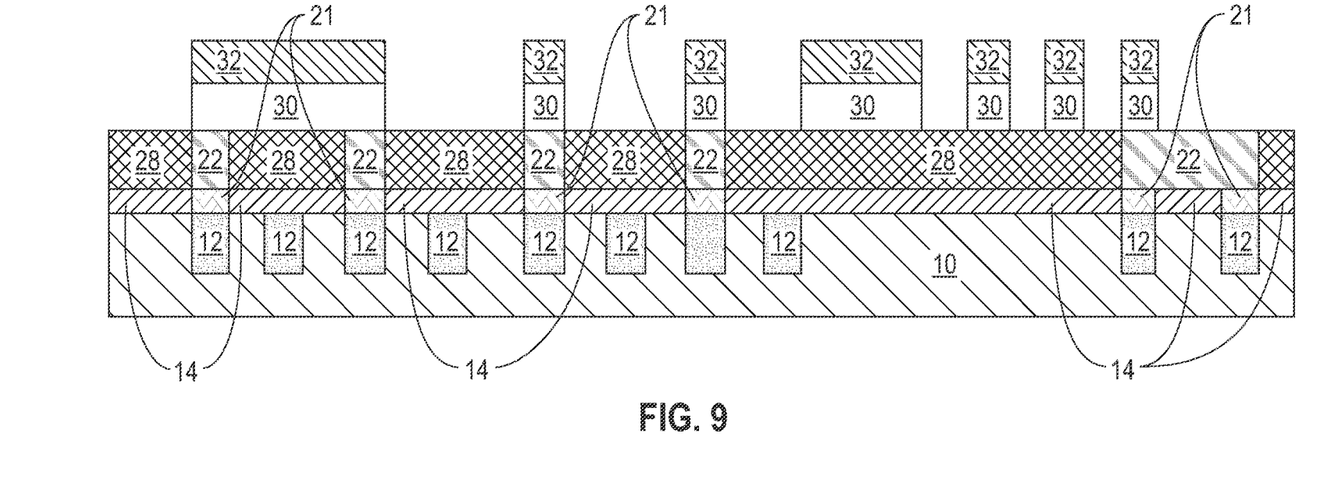
FIG. 9 is a cross sectional view of the BEOL interconnect structure of FIG. 8 after etching the second metal-containing layer to provide second metal-containing structures.

Referring now to FIG. 9, there is illustrated the BEOL structure of FIG. 8 after etching the second metal-containing layer 30L to provide second metal-containing structures 30. The etching of the second metal-containing layer 30L utilizes the third patterned photoresist-containing structure 32 as an etch mask. Each second metal-containing structure 30 constituents a remaining (i.e., non-etched) portion of the second metal-containing layer 30L. Each second metal-containing structure 30 is a trench structure whose dimensions may be the same or different from each other.

The etching of the second metal-containing layer 30L can include any etching process such as, for example, RIE, that is selective in removing the second metal-containing layer 30L that is not protected by the third patterned photoresist-containing structure 32. This RIE is selective to the second metal containing structures 22 and first interconnect dielectric material layer 28. In one example, the RIE used in etching the second metal-containing layer 30L includes a mixture of $Cl_2/BCl_3$—Ar—$CH_4$ or $CF_4/Ar$.

Figure 10:
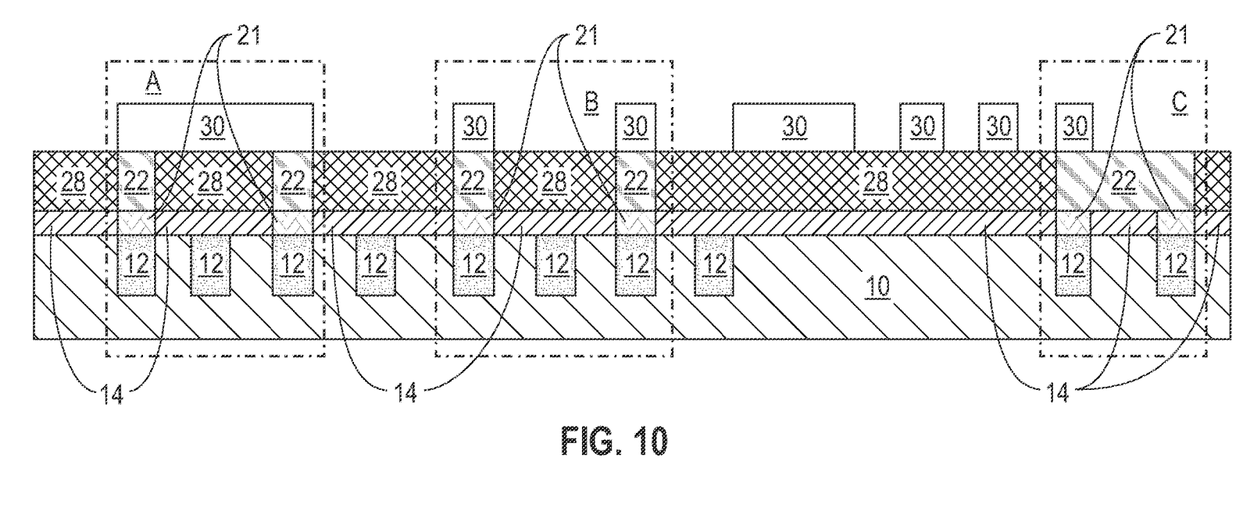
FIG. 10 is a cross sectional view of the BEOL interconnect structure of FIG. 9 after removing the third patterned photoresist-containing structure.

Referring now to FIG. 10, there is illustrated the BEOL interconnect structure of FIG. 8 after removing the third patterned photoresist-containing structure 32. The third patterned photoresist-containing structure 32 can be removed utilizing techniques well known to those skilled in the art. For example, the third patterned photoresist-containing structure 32 can be removed utilizing a resist stripping process such as, for example, ashing, together with one or more material removal processes such as, for example, etching and/or planarization.

In FIG. 10, three areas, A, B and C, are highlighted. Area A represents an area in which via chamfering is avoided. Area B is an area in which no via blow out with isolation is observed. The first metal-containing structures in the areas A and B are self-aligned to the underlying selective metal-containing caps 21 and the electrically conductive structures 12. Area C is an area in which a trench structure (i.e. second metal-containing structure 30) is located on a via bar structure (i.e., the first metal-containing structure 22).

Figure 11:
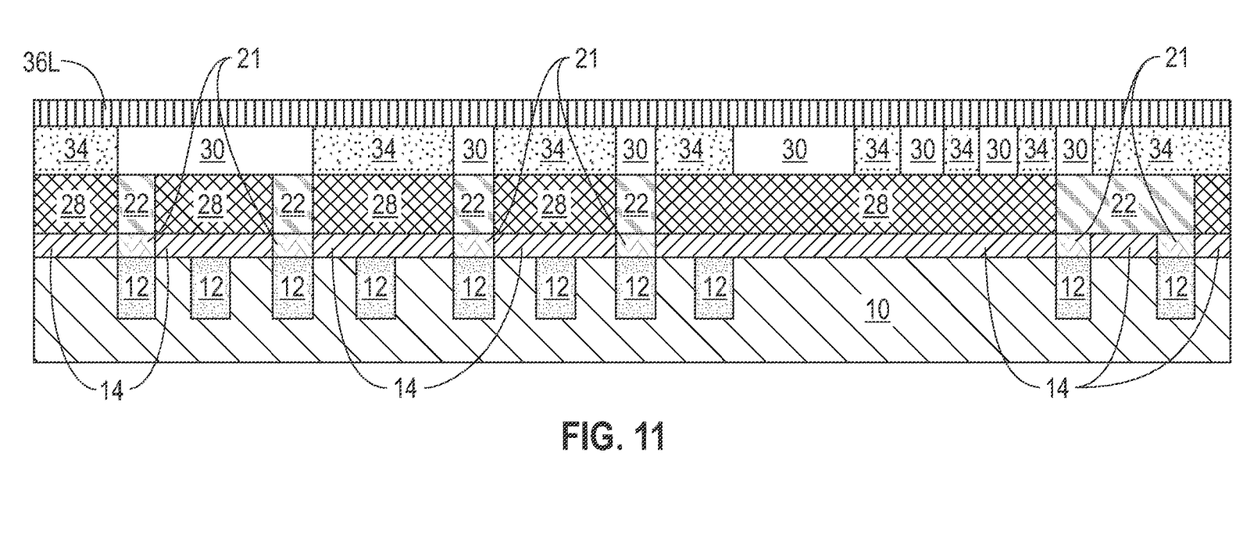
FIG. 11 is a cross sectional view of the BEOL interconnect structure of FIG. 10 after forming a second interconnect dielectric material layer laterally adjacent to each second metal-containing structure and on the first interconnect dielectric material layer, and thereafter forming another dielectric capping layer on the second interconnect dielectric material layer and each second metal-containing structure.

Referring now to FIG. 11, there is illustrated the BEOL interconnect structure of FIG. 10 after forming a second interconnect dielectric material layer 34 laterally adjacent to each second metal-containing structure 30 and on the first interconnect dielectric material layer 28, and forming another dielectric capping layer 36L on the second interconnect dielectric material layer 34 and each second metal-containing structure 30.

The second interconnect dielectric material layer 34 can include one of the dielectric materials mentioned above for first interconnect dielectric material layer 28. In one embodiment, the second interconnect dielectric material layer 34 is composed of a compositionally same dielectric material as the first interconnect dielectric material layer 28. In another embodiment, the second interconnect dielectric material layer 34 is composed of a dielectric material that is compositionally different from the first interconnect dielectric material layer 28. The second interconnect dielectric material layer 34 can be formed utilizing one of the deposition processes mentioned above for forming the dielectric material layer 10. Following the deposition of the dielectric material that provides the second interconnect dielectric material layer 34, a planarization process such as, for example, CMP, can be used to provide the planar BEOL interconnect structure shown in FIG. 11.

The another dielectric capping layer 36L can be composed of one of the dielectric capping materials mentioned above for dielectric capping layer 14L; in the present application dielectric capping layer 14L can be referred to as a first dielectric capping layer, while the another dielectric capping layer 36L can be referred to as a second dielectric capping layer. In one embodiment, the another dielectric capping layer 36L is composed of a compositionally same dielectric capping material as the dielectric capping layer 14L. In another embodiment, the another dielectric capping layer 36L is composed of a dielectric capping material that is compositionally different from the dielectric capping layer 14L. The another dielectric capping layer 36L can be formed utilizing one of the deposition processes mentioned above for forming the dielectric capping layer 14L.

Figure 12:
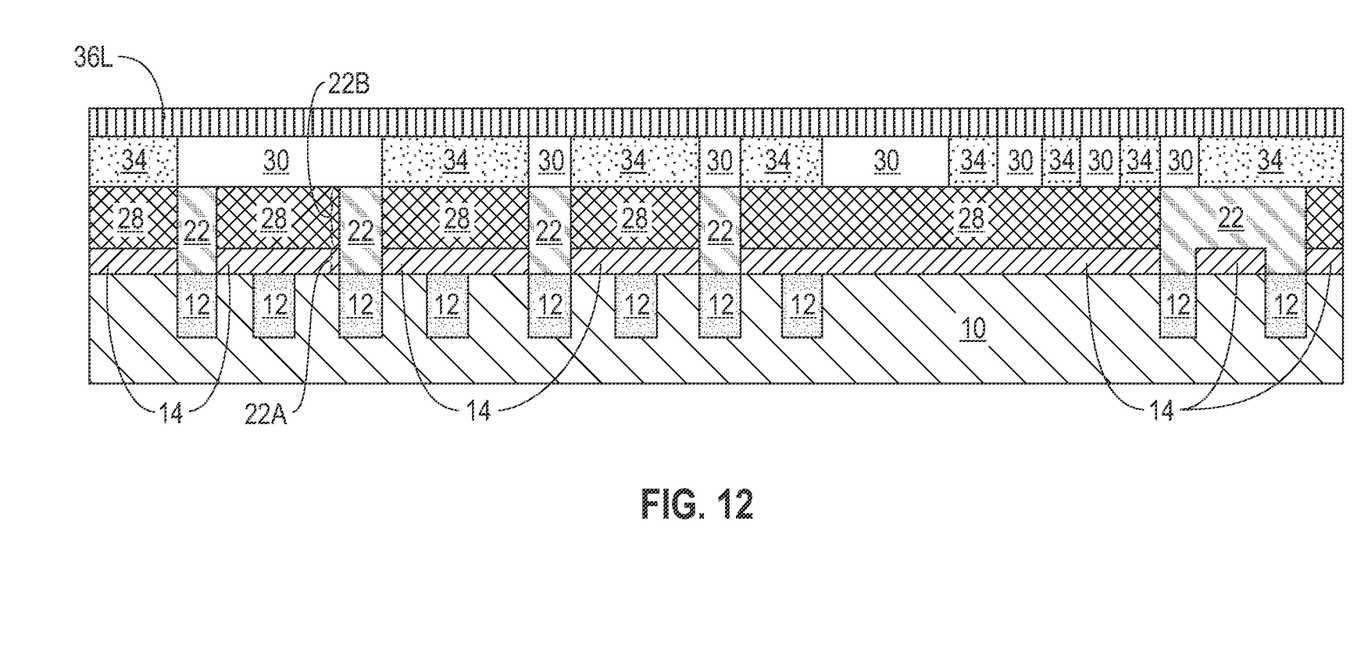
FIG. 12 is a cross sectional view of the BEOL interconnect structure of FIG. 4A after performing the various processes steps illustrated in FIGS. 5-11.

Referring now to FIG. 12, there is illustrated the BEOL interconnect structure of FIG. 4A after performing the various processes steps illustrated in FIGS. 5-11. In FIG. 12, each first metal-containing-structure 22 contains an upper portion 22A and a lower portion 22B. As is shown, the upper portion 22A of a particular first metal-containing structure 22 extends vertically upward from the lower portion 22B; the lower portion 22A is contained in the via opening 20 and the upper portion 22B extends outside the via opening 20 and is located above the patterned dielectric capping layer 14.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a back-end-of-the-line interconnect structure, the method comprising:
    forming a dielectric capping layer on a surface of a metal level, wherein the metal level comprises a plurality of electrically conductive structures embedded in a dielectric material layer;
    forming via openings into the dielectric capping layer, wherein each of the via openings physically exposes a surface of one of the electrically conductive structures embedded in the dielectric material layer;
    forming a first metal-containing layer in each of the via openings and on a topmost surface of the dielectric capping layer;
    etching the first metal-containing layer utilizing a patterned photoresist-containing structure as a first etch mask to provide first metal-containing structures, wherein each of the first metal-containing structures has a lower portion located in one of the via openings and an upper portion extending vertically upwards from the lower portion;
    forming a first interconnect dielectric material layer laterally adjacent to the upper portion of each of the first metal-containing structures, wherein the patterned photoresist-containing structure is entirely removed after forming the first metal-containing structures and prior to forming the first interconnect dielectric material layer such that a topmost surface of each first metal-containing structure is physically exposed prior to forming the first interconnect dielectric material layer;
    forming a second metal-containing layer on the first interconnect dielectric material layer and each of the first metal-containing structures;
    etching the second metal-containing layer utilizing another patterned photoresist-containing structure as a second etch mask to provide second metal-containing structures; and
    forming a second interconnect dielectric material layer laterally adjacent to each of the second metal-containing structures and on the first interconnect dielectric material layer, wherein the another patterned photoresist-containing structure is entirely removed after forming the second metal-containing structures and prior to forming the second interconnect dielectric material layer such that a topmost surface of each second metal-containing structure is physically exposed prior to forming the second interconnect dielectric material layer.

2. The method of claim 1, further comprising forming another dielectric capping layer on the second interconnect dielectric material layer and each of the second metal-containing structures.

3. The method of claim 1, wherein the patterned photoresist-containing structure and the another patterned photoresist-containing structure comprise a trilayer structure including, from top to bottom, a photoresist material, a hard mask, and an organic planarization layer (OPL), or a quad-layer structure including, from top to bottom, a photoresist material, an antireflective coating (ARC) or bottom ARC, a hard mask and an OPL.

4. The method of claim 1, wherein the patterned photoresist-containing structure and the another patterned photoresist-containing structure are formed utilizing optical lithography.

5. The method of claim 1, wherein the patterned photoresist-containing structure and the another patterned photoresist-containing structure are formed utilizing EUV lithography.

6. The method of claim 1, wherein the first metal-containing layer and the second metal-containing layer are composed of a compositionally different electrically conductive metal or metal alloy.

7. The method of claim 1, wherein the first metal-containing layer is composed of an electrically conductive metal or metal alloy that is compositionally different from an electrically conductive metal or metal alloy that provides each of the electrically conductive structures.

8. The method of claim 1, wherein each of the first metal-containing structures is a via structure having a topmost surface that is coplanar with a topmost surface of the first interconnect dielectric material layer.

9. The method of claim 8, wherein each of the second metal-containing structures is a trench structure having a topmost surface that is coplanar with a topmost surface of the second interconnect dielectric material layer.

10. A method of forming a back-end-of-the-line interconnect structure, the method comprising:
forming a dielectric capping layer on a surface of a metal level, wherein the metal level comprises a plurality of electrically conductive structures embedded in a dielectric material layer;
forming via openings into the dielectric capping layer, wherein each of the via openings physically exposes a surface of one of the electrically conductive structures embedded in the dielectric material layer;
forming a selective metal-containing cap in each of the via openings;
forming a first metal-containing layer on each of the selective metal-containing caps and on a topmost surface of the dielectric capping layer;
etching the first metal-containing layer utilizing a patterned photoresist-containing structure as a first etch mask to provide first metal-containing structures;
forming a first interconnect dielectric material layer laterally adjacent each of the first metal-containing structures, wherein the patterned photoresist-containing structure is entirely removed after forming the first metal-containing structures and prior to forming the first interconnect dielectric material layer such that a topmost surface of each first metal-containing structure is physically exposed prior to forming the first interconnect dielectric material layer;
forming a second metal-containing layer on the first interconnect dielectric material layer and each of the first metal-containing structures;
etching the second metal-containing layer utilizing another patterned photoresist-containing structure as a second etch mask to provide second metal-containing structures; and
forming a second interconnect dielectric material layer laterally adjacent to each of the second metal-containing structures and on the first interconnect dielectric material layer, wherein the another patterned photoresist-containing structure is entirely removed after forming the second metal-containing structures and prior to forming the second interconnect dielectric material layer such that a topmost surface of each second metal-containing structure is physically exposed prior to forming the second interconnect dielectric material layer.

11. The method of claim 10, further comprising forming another dielectric capping layer on the second interconnect dielectric material layer and each of the second metal-containing structures.

12. The method of claim 10, wherein each of the selective metal-containing caps has a topmost surface that is coplanar with the topmost surface of the dielectric capping layer.

13. The method of claim 10, wherein the patterned photoresist-containing structure and the another patterned photoresist-containing structure comprise a trilayer structure including, from top to bottom, a photoresist material, a hard mask, and an organic planarization layer (OPL), or a quad-layer structure including, from top to bottom, a photoresist material, an antireflective coating (ARC) or bottom ARC, a hard mask and an OPL.

14. The method of claim 10, wherein the patterned photoresist-containing structure and the another patterned photoresist-containing structure are formed utilizing optical lithography.

15. The method of claim 10, wherein the patterned photoresist-containing structure and the another patterned photoresist-containing structure are formed utilizing EUV lithography.

16. The method of claim 10, wherein the first metal-containing layer and the second metal-containing layer are composed of a compositionally different electrically conductive metal or metal alloy.

17. The method of claim 10 wherein the first metal-containing layer is composed of an electrically conductive metal or metal alloy that is compositionally different from an electrically conductive metal or metal alloy that provides each of the electrically conductive structures.

18. The method of claim 10, wherein each of the first metal-containing structures is a via structure having a topmost surface that is coplanar with a topmost surface of the first interconnect dielectric material layer.

19. The method of claim 18, wherein each of the second metal-containing structures is a trench structure having a topmost surface that is coplanar with a topmost surface of the second interconnect dielectric material layer.

20. The method of claim 10, wherein each of the selective metal-containing caps is formed utilizing a selective deposition process.

* * * * *